United States Patent [19]

Ema

[11] Patent Number: 5,561,623
[45] Date of Patent: Oct. 1, 1996

[54] HIGH SPEED DRAM WITH NOVEL WIRING STRUCTURE

[75] Inventor: Taiji Ema, Kawasaki, Japan

[73] Assignee: Fujitsu Limited, Kawasaki, Japan

[21] Appl. No.: 384,822

[22] Filed: Feb. 7, 1995

[30] Foreign Application Priority Data

Feb. 9, 1994 [JP] Japan .................................. 6-015011

[51] Int. Cl.$^6$ .......................... H01L 27/108; H01L 23/50
[52] U.S. Cl. ................................. 365/51; 365/63; 365/72; 257/401; 257/390
[58] Field of Search ........................... 365/51, 63, 233.5, 365/230.03, 72; 257/401, 390

[56] References Cited

U.S. PATENT DOCUMENTS

| | | | |
|---|---|---|---|
| 4,977,538 | 12/1990 | Anami et al. | 365/230.03 |
| 5,193,076 | 3/1993 | Houston | 365/233.5 |
| 5,422,839 | 6/1995 | Ishibashi et al. | 365/51 |
| 5,423,730 | 7/1995 | Shubat et al. | 365/63 |

Primary Examiner—Viet Q. Nguyen
Attorney, Agent, or Firm—Nikaido, Marmelstein, Murray & Oram LLP

[57] ABSTRACT

A semiconductor storage device of a high capacity operating at high speed includes a plurality of memory cell array blocks, each including memory cells disposed in a matrix shape of rows and columns, word lines each connected to memory cells of an associated row, a row decoder for selecting a word line, bit lines each connected to memory cells of an associated select transistor and having an input (source) electrode connected to a bit line, a column select line connected to a gate electrode of the sense amplifier select transistor, a column decoder for selecting a column select line, and data bus lines connected to output (drain) electrodes of the sense amplifier select transistors, wherein the column select lines are disposed intersecting the word lines and the data bus line, the word lines are formed by a first wiring layer, the column select lines are formed by a second wiring layer, and the data bus lines are formed by a third wiring layer. Both fine word lines and low resistance data bus lines are realized.

16 Claims, 14 Drawing Sheets

MEMORY CELL          PERIPHERAL CIRCUIT 5,561,623

HIGH SPEED DRAM WITH NOVEL WIRING STRUCTURE

BACKGROUND OF THE INVENTION a) Field of the Invention

The present invention relates to a semiconductor storage device, particularly to a high speed dynamic random access memory (DRAM).

b) Description of the Related Art

FIG. 6 is a schematic plan view showing a layout of a conventional DRAM chip.

The DRAM chip 71 has input/output pads 72, column decoders 73, column select signal lines 74, sense amplifiers 75, data bus lines 76, memory cell array blocks 77, word lines 78, and row decoders 79.

As shown in FIG. 6, a plurality of input/output (I/0) pads 72 are disposed in line at the center of the chip 71 in the vertical direction as viewed in FIG. 6. The column decoders CD 73 are disposed near the center of the longer side of the chip 71 in the horizontal direction as viewed in FIG. 6. A column address signal selected by the column decoder 73 is supplied via a column select signal line 74 formed in parallel with the longer side of the chip 71, to the select side (the gate electrode of a column select transistor) of each sense amplifier (S/A) 75. Bit lines BL from each memory cell array block are formed in parallel with column select lines CLS.

Each data bus line 76a for sending an output (information on a selected bit line) at the output side (source of drain electrode of each column select transistor) of each S/A 75 is disposed in parallel with the shorter side of the chip 71, and connected to an output circuit 80 of S/A 75. An amplified signal is supplied via a data bus line 76b to the corresponding I/0 pad 72.

Memory cell array blocks 77, each including memory cells in a matrix shape are disposed on both sides of the train of I/0 pads 72. Bit lines BL 105 connect the memory cells with the input side of S/A 75 and are formed of silicide film. Bit lines 105 extend in parallel with the longer side of the chip 71. Each word line 78 extends in parallel with the shorter side of the chip 71 and connects memory cells with a row decoder RD 79 disposed on either side of the I/0 pads 72.

FIGS. 7A to 7D are cross sectional views explaining the conventional processes of manufacturing a DRAM chip.

Constituent elements of the DRAM chip represented by reference numerals in FIGS. 7A to 7D include a semiconductor Si substrate 81, a field oxide film 82, a source diffusion layer 83, a drain diffusion layer 84, a gate insulating film 85, a gate electrode 86, a storage electrode 87, a capacitor dielectric layer 88, an opposing or common electrode 89, a source diffusion layer 90, a drain diffusion layer 91, a gate insulating film 92, a gate electrode 93, a first $SiO_2$ film 94, a second $SiO_2$ film 95, a BPSG film 96, through holes 96a and 96b, a Ti film 97, a TiN film 98, a W film 99, a W plug 99a, an Al film 100, a word line 100a, a source wiring 100b, a drain wiring 100c, a bit line 105, a TiN film 111, plasma oxide films 112 and 113, a spin-on-glass (SOG) film 114, a plasma oxide film 115, and a via hole 115a.

The conventional processes of manufacturing a DRAM chip will be described with reference to FIGS. 7A to 7D.
First process (refer to FIG. 7A)

Active regions are defined by the field oxide film 82. In one active region, a memory cell constituted by a MOSFET and a storage capacitor is formed, the MOSFET including the source diffusion layer 83, drain diffusion layer 84, gate insulating film 85, gate electrode 86, and source electrode 105 constituting the bit line BL, and the storage capacitor including the storage electrode 87, dielectric layer 88, and opposing electrode 89, respectively formed over the drain diffusion layer 84. In another active region, a peripheral circuit such as a sense amplifier S/A is formed which includes a MOSFET constituted by the source diffusion layer 90, drain diffusion layer 91, gate insulating film 92, and gate electrode 93.

The BPSG film 96 covers the memory cell and the peripheral circuit such as S/A. The first and second $SiO_2$ films 94 and 95 and the BPSG film 96 in the region of the peripheral circuit such as S/A are selectively etched to form the through holes 96a and 96b exposing the source and drain diffusion layers 90 and 91.
Second process (refer to FIG. 7B )

On the BPSG film 96 with the through holes 96a and 96b formed by the first process, the Ti film 97 is sputtered to a thickness of 20 nm. The TiN film 98 is sputtered on the Ti film 97 to a thickness of 50 nm to be used as a glue layer of the W film 99, to be formed later, for enhancing adhesion to the BPSG film 96.

Next, in order to improve a coverage of the Al film 100 to be formed by the later sputtering process, the W film 99 is grown on the TiN film 98 to a thickness of 500 nm by chemical vapor deposition (CVD). The W film 99 is etched back to expose the Tin film 98 with a planarized surface and fill the through holes 96a and 96b with the W plug 99a.
Third process (refer to FIG. 7C)

On the TiN film 98 exposed at the second process, the Al film 100 is sputtered to a thickness of 0.5 μm. The TiN film 112 is sputtered on the Al film 100 to a thickness of 0.15 μm, and the plasma oxide film 112 is grown on the TiN film 111 to a thickness of 0.1 μm.

Next, the plasma oxide film 112, TiN film 111, Al film 100, TiN film 98, and Ti film 97 are selectively etched by photolithography (and reactive ion etching (RIE)) to form the word line 100a, source wiring 100b, drain wiring 100c, and data bus line (refer to FIG. 6).

If the TiN film 111 on the Al film 100 is omitted, a via contact structure to be later formed by Al wiring directly contacts the Al film 100. In this case, voids may be generated in the contact surface by Al migration and a contact defect is likely to occur. A direct contact between two Al films at a minute region results in a device defect if a void is formed in Al, so that a reliability is greatly deteriorated. In order to avoid this, it is necessary to use a material other than Al at the minute region in a via hole exposing the Al film 100. The TiN film 111 is formed on the Al film 100 from the reason described above.

Since the Al film 100 is thick, an etching mask function is insufficient if only a resist film is used in photolithography. The plasma oxide film 112 is introduced in order to improve the etching mask function.

The TiN film 111, Al film 100, TiN film 98, and Ti film 97 all can be etched by the same etching system.
Fourth process (refer to FIG. 7D)

The plasma oxide film ($SiO_2$) 118 is grown to a thickness of 200 nm on the word line 100a, source wiring 100b, drain wiring 100c, and data bus line (in parallel to the word line, not shown). SOG is coated on the plasma oxide film 113 and cured to form the SOG film 114 filling the trenches between the wiring films. On the SOG film 114, the plasma oxide film ($SiO_2$) 115 is formed to a thickness of 700 nm. Next, the via hole 115a is formed from the surface of the plasma oxide film 115 to the surface of the TiN layer 111 by photolithography.

With this manufacturing method, however, if the Al film 100 is made thick in order to reduce the resistance of the data bus line, the spaces between the word lines 100a formed by the Al film 100 become deep, forming deep and narrow trenches. The pitch of the word lines cannot be widened arbitrarily. Since it is difficult to fill the deep trenches by an easy way such as a TEOS-$O_3$ oxide film, it becomes necessary to use liquid material such as SOG.

On the plasma oxide film 115, a TiN film is sputtered to a thickness of 100 nm on which film an Al film is sputtered to a thickness of 800 nm. The Al film is then patterned by photolithography and RIE to form CLS lines in the same direction as the bit line 105. A semiconductor storage device is thereafter completed by performing other processes such as forming a passivation film.

A DRAM according to a conventional technique explained with FIG. 6 has the following signal paths. (1) external address signal→row decoder 79→selection of word line 78→output of data in memory cells 77 connected to word line 78, to bit lines 105→detection and amplification by S/A 75 of outputs from bit lines 105, (2) external address signal→column decoder 73→column select line 74→selection of S/A 75, and (3) output of data from S/A 75 via data bus line 76.

In a high speed DRAM such as a synchronous dynamic random access memory (SDRAM), all signals are inputted/outputted synchronously with an external clock for the high speed data input/output. The signal paths described above, particularly the data bus line 76 having a long wiring distance and flowing a relatively large current, is required to suppress a signal transmission delay.

In order to suppress the signal transmission delay on the data bus line 76, a low CR constant is required, where C is a capacitance and R is a resistance. It is therefore desired to use a data bus line having a low resistance and a low parasitic capacitance.

The above-described DRAM according to a conventional technique uses basically the word lines and data bus lines disposed in the horizontal direction of the chip, and the CLS lines disposed in the vertical direction.

The word lines and data bus lines disposed in the horizontal direction are required to intersect the CLS lines disposed in the vertical direction in an insulated state, so that two types of lines are formed by using two different wiring layers.

From the above reason, a two-layer structure including first and second wiring layers has been used, the word lines and data bus lines being formed by the first wiring layer, and the CLS lines being formed by the second wiring layer.

it is necessary to form finer word lines as the memory cell size becomes smaller, whereas the resistance of data bus lines is required to be small in order to suppress the signal transmission delay.

in order to form a data bus line of low resistance, it is desired to use low resistance material such as Al and make a film thick.

However, fine Al wiring is easily susceptible to electromigration and stress migration. In addition, in order to form a fine and thick wiring layer, a special process of realizing a very high aspect ratio is required.

Furthermore, a parasitic capacitance between adjacent wiring layers increases if they are made fine and thick. For example, interference between word lines may raise the level (potential) of a non-selected word line higher than a ground level (zero potential), destructing data in the non-selected memory cell.

Satisfying both the requirements for fine word lines and low resistance data bus lines is becoming more difficult.

SUMMARY OF THE INVENTION

It is an object of the present invention to provide a semiconductor storage device capable of realizing both fine word lines and low resistance data bus lines and allowing a high speed operation and a high storage capacity.

According to one aspect of the present invention, there is provided a semiconductor storage device having a semiconductor chip, comprising: a memory cell array including a plurality of memory cells disposed in a matrix shape; a plurality of word lines each connected to memory cells of a corresponding row; a row decoder for selecting a word line; a plurality of bit lines each connected to memory cells of a corresponding column; a plurality of sense amplifiers each including a sense amplifier select transistor having an input electrode connected to a corresponding bit line; a column select line connected to a gate electrode of each of the sense amplifier select transistor; a column decoder for selecting a column select line; and a data bus line connected to an output electrode of each of the sense amplifier select transistors, wherein the column select lines are disposed intersecting the word lines and the data bus lines, and at least part of the word lines and at least part of the data bus lines are formed by different wiring layers.

word line may be formed by a first level metal wiring layer, the column select line may be formed by a second level metal wiring layer formed over the first level metal wiring layer, and the data bus line may be formed by a third level metal wiring layer formed over the second level metal wiring layer.

The word lines and data bus lines are formed by different wiring layers of a three-layer structure. For example, the word line is formed by a first level W thin wiring layer, the CLS line is formed by a second level Al wiring layer, and the data bus line is formed by a third level Al thick wiring layer. It is therefore possible to provide fine word lines and low resistance data bus lines.

According to another aspect of the present invention, there is provided a semiconductor storage device having a semiconductor chip, including: a memory cell array including a plurality of memory cells disposed in a matrix shape; a plurality of local word lines each connected to memory cells of a corresponding row; a local row decoder for selecting a local word line; a plurality of global word lines each connected to a corresponding local row decoder; a global row decoder for selecting a global word line; a plurality of bit lines each connected to memory cells of a corresponding column; a plurality of sense amplifiers each including a sense amplifier select transistor having an input electrode connected to a corresponding bit line; a column select line connected to a gate electrode of each of the sense amplifier select transistors; a column decoder for selecting a column select line; and a data bus line connected to an output electrode of each of the sense amplifier select transistors, wherein the total word line is formed by a first level metal wiring layer, the column select line is formed by a second level metal wiring layer over the first level metal wiring layer, and the global word line is formed by a third level metal wiring layer over the second level metal wiring layer.

The third level metal wiring layer may be formed by a metal thin plate of a lead frame.

According to a further aspect off the present invention, there is provided a semiconductor storage device having a semiconductor chip, including: a memory cell array including a plurality of memory cells disposed in a matrix shape; a plurality of word lines each connected to memory cells of a corresponding row; a row decoder for selecting a word line; a plurality of bit lines each connected to memory cells of a corresponding column; a plurality of sense amplifiers each including a sense amplifier select transistor having an input electrode connected to a corresponding bit line; a column select line connected to a gate electrode of each of the sense amplifier select transistors; a column decoder for selecting a column select line; and a data bus line connected to an output electrode of each of the sense amplifier select transistors, wherein the word lines are formed by a first level metal wiring layer, the data bus lines are formed by a second level metal wiring layer over the first level metal wiring layer, and the column select lines are formed by the second level metal wiring layer at a region corresponding to the memory cell array, and by the first level metal wiring layer at a region corresponding to the sense amplifiers.

The two-layer structure is used. For example, the word lines are formed by a first level W thin wiring layer, and the data bus lines are formed by a second level Al thick wiring layer. The CLS lines are formed by the second level Al thick layer at a region of the memory cell array block, and by the first level W thin wiring layer at a region of S/A. It is therefore possible to provide fine word lines, and data bus lines having a lower resistance than a conventional technique.

Basically, if word lines and data bus lines are formed by different wiring layers, both the fine word lines and the suppressed signal transmission delay on data bus lines can be achieved without any particular restrain in the wiring of both types of lines.

The invention contributes much to a high integration and a high speed operation of a semiconductor storage device such as DRAM.

BRIEF DESCRIPTION OF THE DRAWINGS

FIG. 5A to 5F show fourth embodiment of the invention, wherein FIGS. 5A and 5B are a schematic plan and a cross sectional views illustrating the relation between a lead frame and a chip, FIG. 5C is a schematic plan view illustrating connection between wirings on the chip and the lead frame, FIG. 5D is a schematic plan view illustrating the relation between metal mold and the chip, and FIGS. 5E and 5F are cross sectional views illustrating a method of cutting a lead frame after resin molding.

DETAILED DESCRIPTION OF THE PREFERRED EMBODIMENTS

Embodiments of the invention will be described in the following.

(First Embodiment)

Figure 1A:
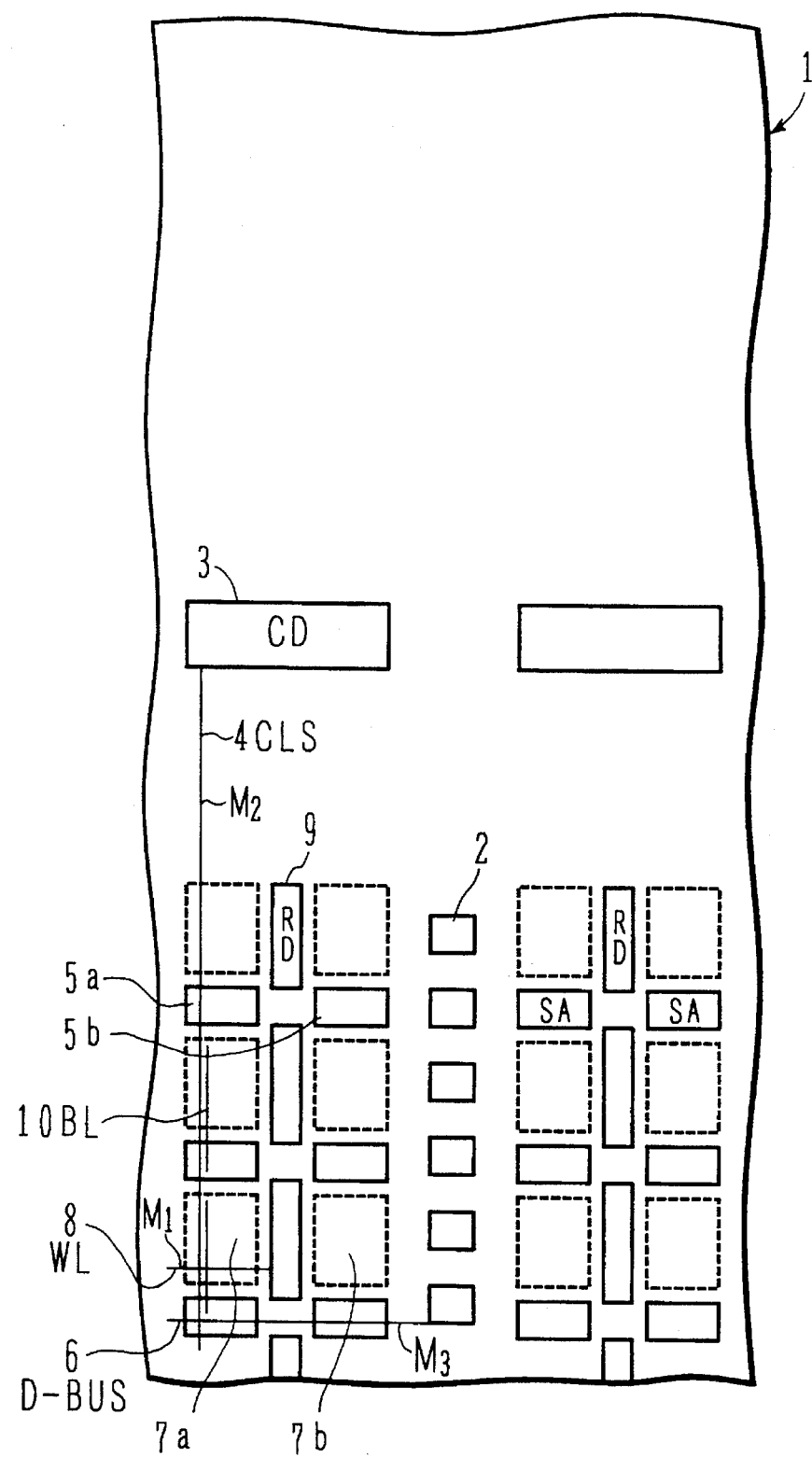
FIGS. 1A and 1B are a schematic plan view showing a layout of a DRAM chip according to a first embodiment of the invention, and a circuit diagram of a sense amplifier circuit.

FIG. 1A is a schematic plan view showing a layout of a DRAM chip according to a first embodiment of the invention. A silicon chip 1 shown in FIG. 1A includes input/output pads 2, column decoders 3, column select lines 4, sense amplifiers 5a, 5b, data bus lines 6, memory cell array blocks 7a, 7b, word lines 8, row decoders 9, and bit lines 10.

As shown in FIG. 1A, a plurality of input/output (I/O) pads 2 are disposed in line at the center of the chip 1 in the vertical direction as viewed in FIG. 1A. The column decoders CD 3 are disposed near the center of the longer side of the chip 1 in the horizontal direction as viewed in FIG. 1A. A column address signal selected by the column decoder 3 is supplied via a column select signal (CLS) line 4 formed in parallel with the longer side of the chip 1, to the column select input terminal of each sense amplifier (S/A) 5a, 5b.

Figure 1B:
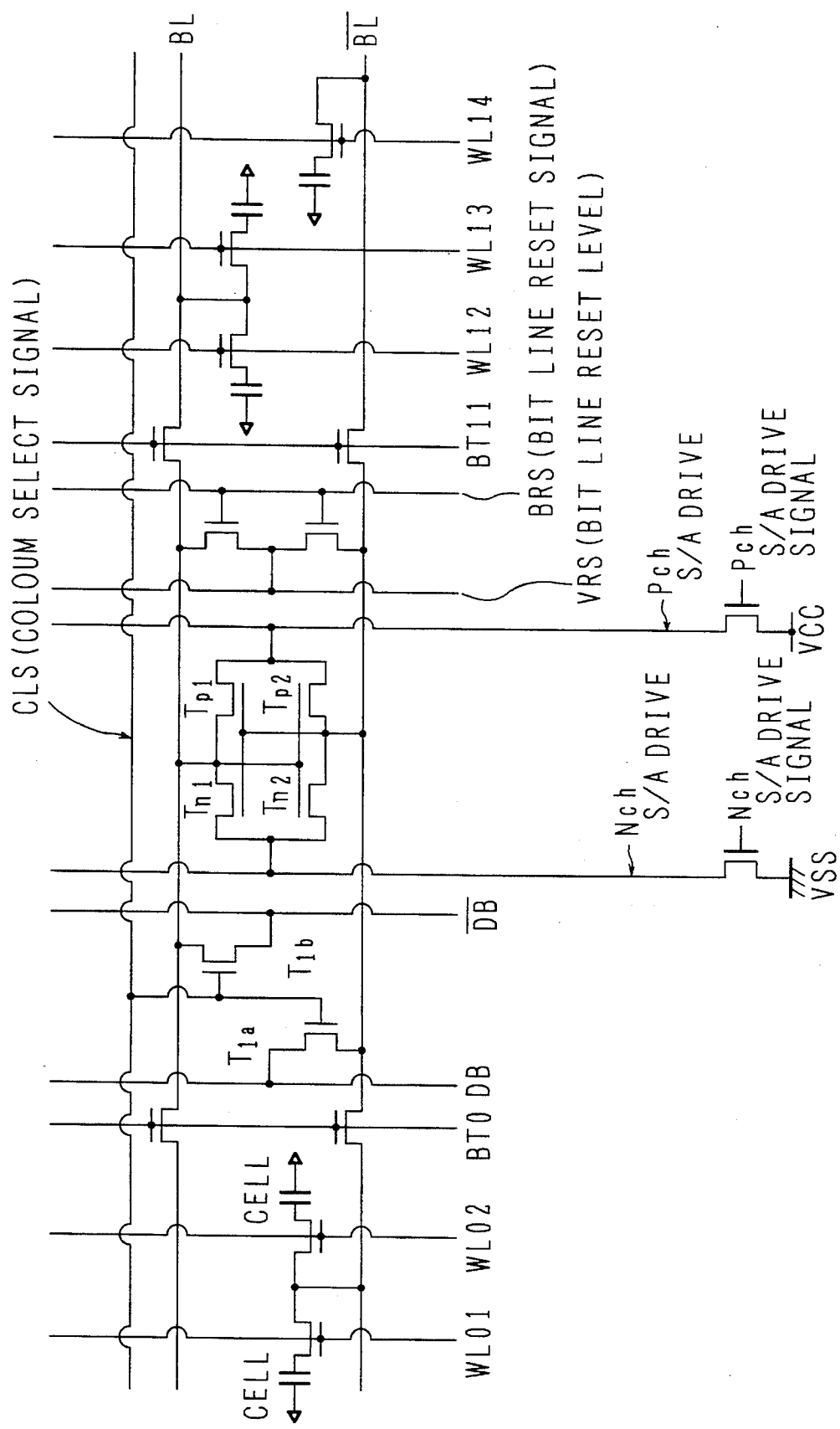

FIG. 1B shows a sense amplifier S/A corresponding to one column. A pair of bit lines BL and BL are connected to a flip-flop made of n-channel transistors Tn1 and Tn2 and p-channel transistors Tp1 and Tp2, and via column select transistors T1a and T1b to data bus lines DB and DB. A CLS line is connected to the gates of transistors T1a and T1b.

Referring back to FIG. 1A, a data bus line 6 for transferring an output from S/A 5a, 5b is disposed in parallel with the shorter side of the chip 1, and connected via the output circuit of S/A 5a, 5b to the I/O pad 2.

Figure 2A:
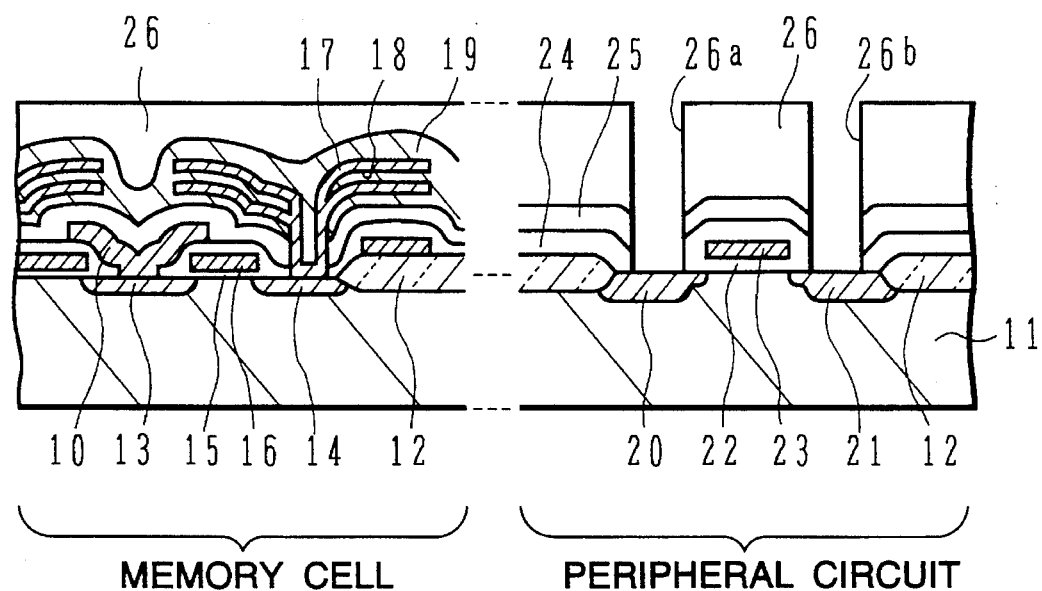
FIGS. 2A to 2F are cross sectional views explaining the main processes of a method of manufacturing a DRAM chip of the first embodiment.

Bit lines 10 and word lines 8 are formed in each of memory cell array blocks 7a and 7b. Each memory cell array block includes memory cells disposed in a matrix of now and columns. The memory cell array blocks are disposed also in a matrix shape and divided into two groups on both sides of I/O pads 2. The bit line 10 made of a silicide film extends in parallel with the longer side of the chip 1 and is connected to the input side of an S/A 5a, 5b. The word line 8 extends in parallel with the shorter side of the chip 1 and is connected to a row decoder (RD) 9. Row decoders 9 are disposed between the memory cell array blocks 7a and 7b on the right and left sides of the I/O pads 2.

leach memory cell array block 7a, 7b has a structure of 128 (bit line pairs)×256 (word lines). Each memory cell of the DRAM chip of this embodiment is a fin-stacked type capacitor cell proposed by the present inventors such as shown in FIG. 2A. The size of one memory cell is 0.75 μm (word line pitch)×1.7 μm (sense amplifier pitch)=1.275 μm$^2$.

As a first wiring layer (M1) for forming word lines, a tungsten (W) thin film of 400 nm is used to solve the problems of a wiring aspect ratio and migration associated with word lines of a conventional DRAM chip. Each word line has a width of 0.35 μm and a distance (gap) of 0.40 μm from an adjacent word line.

The sheet resistance of the first wiring layer (M1) made of a tungsten thin film is 0.3 Ω/ which is higher than that of aluminum (Al). Therefore, the row decoders 9 are disposed between the memory cell array blocks 7a and 7b on both sides of the input pads 2 to halve the distance from each row decoder 9 to the end of each word line and to suppress a signal transmission delay on the word line. The number of row decoders on the chip may be increased.

Since a thin W film with a low wiring aspect ratio is used, fine patterning of a word line is easy and surface planarization of an insulating film after forming the word line is also easy. This wiring layer may be used not only for word lines, but also for wiring lines of other peripheral circuits.

As a second wiring layer (M2) for forming mainly CLS lines and power supply lines, a laminated structure of a titanium nitride (TiN) film of 100 nm thickness and an aluminum (Al) film of 500 nm is used. The width of a CLS line is 1.00 μm, and a spacing between adjacent CLS lines is, for example, 0.7 μm.

The wiring width should be set relatively large so that the Al layer used as the wiring material, is set to have a relatively small thickness of 500 nm in order to facilitate planarization after forming the wiring layer.

Because of a sufficiently small wiring aspect ratio, fine patterning of a wiring layer is easy and the wiring layer may be used for wiring lines of other peripheral circuits.

As a third wiring layer (M3) for forming mainly data bus lines, long distance lines, and power supply lines, an aluminum (Al) film of 1 μm thickness is used. It is not necessary to set a wiring layer width so fine. Therefore, in order not to use an expensive stepper, the width is set large, for example, 5 μm.

Use of these three wiring layers improves the degree of design freedom and relieves process constrains. Although two masks are additionally used, an increase of the number of processes and cost-up are substantially small because of a large tolerance of mask size precision, particularly of the third wiring layer mask.

FIGS. 2A to 2F are cross sectional views explaining the main processes of a method of manufacturing a DRAM chip of the first embodiment.

Constituent elements of the DRAM chip represented by reference numerals in FIGS. 2A to 2F include a semiconductor substrate 11, a field oxide film 12, a source diffusion layer 13, a drain diffusion layer 14, a gate insulating film 15, a gate electrode 16, a bit line 10, a storage electrode 17, a dielectric layer 18, an opposing or common electrode 19, a source diffusion layer 20, a drain diffusion layer 21, a gate insulating film 22, a gate electrode 23, a first $SiO_2$ film 24, a second $SiO_2$ film 25, a BPSG film 26, through holes 26a and 26b, a Ti film 27, a TiN film 28, a W film 29, a word line 29a, a source wiring line 29b, a drain wiring line 29c, a plasma oxide film 30, a TEOS-$0_3$ oxide film 31, a via hole 31a, a TiN film 32, an Al film 33, a CLS line 33a, a plasma oxide film 34, a TEOS-03 oxide film 35, a via hole 35a, an Al film 36, a data bus line 36a, and a global word line 36b.

The method of manufacturing a DRAM chip of the first embodiment will be described with reference to FIGS. 2A to 2F.

First process (refer to FIG. 2A)

Active regions are defined by the field oxide film 12 formed on the semiconductor substrate 11 such as silicon. In a memory cell forming region, a memory cell constituted by a MOSFET and a storage capacitor is formed, the MOSFET including the source diffusion layer 13, bit line 10, drain diffusion layer 14, gate insulating film 15, and gate electrode 16, and the storage capacitor including the storage electrode 17, dielectric layer 18, and opposing electrode 19, respectively formed over the drain diffusion layer 14. In a peripheral circuit forming region, a peripheral circuit such as a sense amplifier S/A is formed which includes a MOSFET constituted by the source diffusion layer 20, drain diffusion layer 21, gate insulating film 22, and gate electrode 23. The transistor of the peripheral circuit shown in FIG. 2A is assumed to be the transistor of a sense amplifier.

The BPSG film 26 covers the memory cell and the peripheral circuit such as S/A. The first and second $SiO_2$ films 24 and 25 and the BPSG film 26 in the region of the peripheral circuit such as S/A are selectively etched to form the through holes 26a and 26b exposing the source and drain diffusion layers 20 and 21.

Figure 2B:
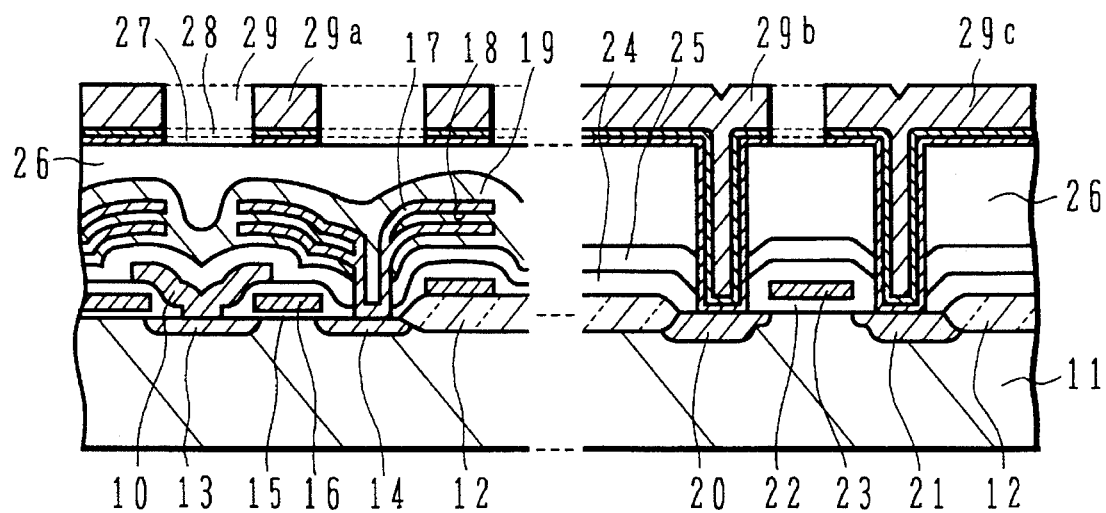
Figure 2C:
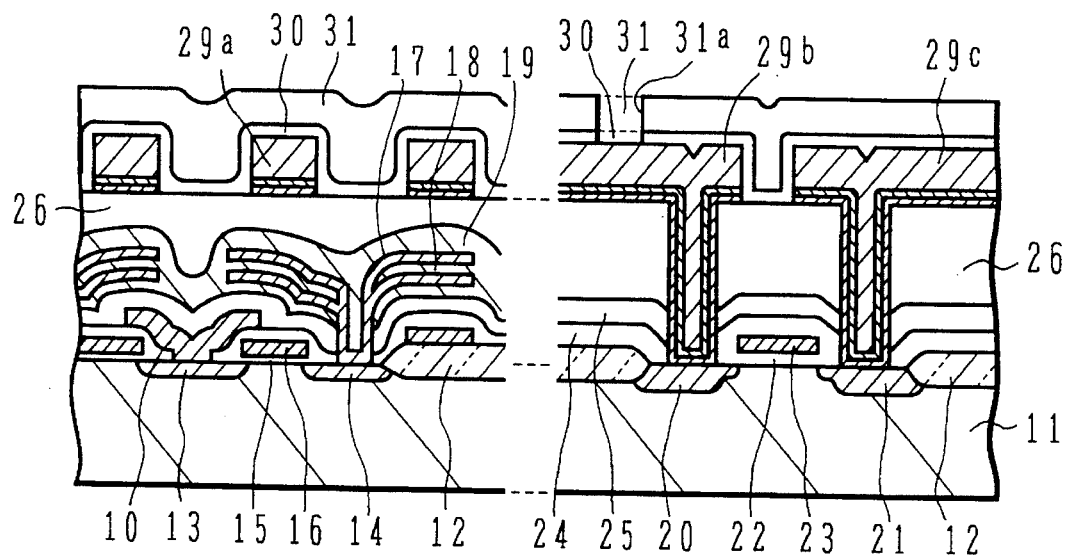

Second process (refer to FIG. 2B)

On the BPSG film 26 with the through holes 26a and 26b formed by the first process, the Ti film 27 is sputtered to a thickness of 20 nm. The TiN film 28 is sputtered on the Ti film 27 to a thickness of 50 nm. The W film 29 having a sheet resistance of 0.3 Ω/ is grown on the TiN film 28 by CVD.

Next, the W film 29, TiN film 28, and Ti film 27 are selectively etched by photolithography and RIE to form the word lines 29a on the memory cell array block and the source and drain wiring lines 29b and 29c of the peripheral circuit.

The reason of using W as the wiring material is as follows. The through holes 26a and 26b are small and deep so that a coverage of a wiring layer may become poor if the layer is formed by sputtering. If a W film is formed by CVD, a good coverage can be easily obtained. A W film is highly resistant against electromigration and stress migration so that a reliability of even a fine narrow wiring layer is not degraded.

The reason of forming the Ti film 27 and TiN film 28 under the W film 29 is to improve a poor adhesion of the W film 29 grown by CVD with the BPSG film 26 and $SiO_2$ film, and a high contact resistance with Si. These Ti film 27 and TiN film 28 are called glue layers. Third process (refer to FIG. 2C)

On the word line 29a, source wiring line 29b, and drain wiring line 29c, the plasma oxide film 30 of 100 nm thickness and the TEOS-$0_3$ oxide film 31 of 800 nm thickness are grown. The via hole 31a is formed by photolithography and RIE to partially expose the surface of the source wiring line 29b of the peripheral circuit such as S/A.

The TEOS-$O_3$, oxide film 31 is an oxide $SiO_2$ film grown by CVD by using TEOS and 03 as source gases, this film showing fluidity and being capable of filling a recess. The underlying plasma oxide film 30 is used for planarizing the TEOS-$0_3$ oxide film 31 by providing a uniform underlie because the growth of the film 31 depends on the underlying surface, and is also used as a blocking film for preventing hydrogen, which is a by product during the growth of the TEOS-$0_3$ oxide film 31, from entering the transistor active region.

Figure 2D:
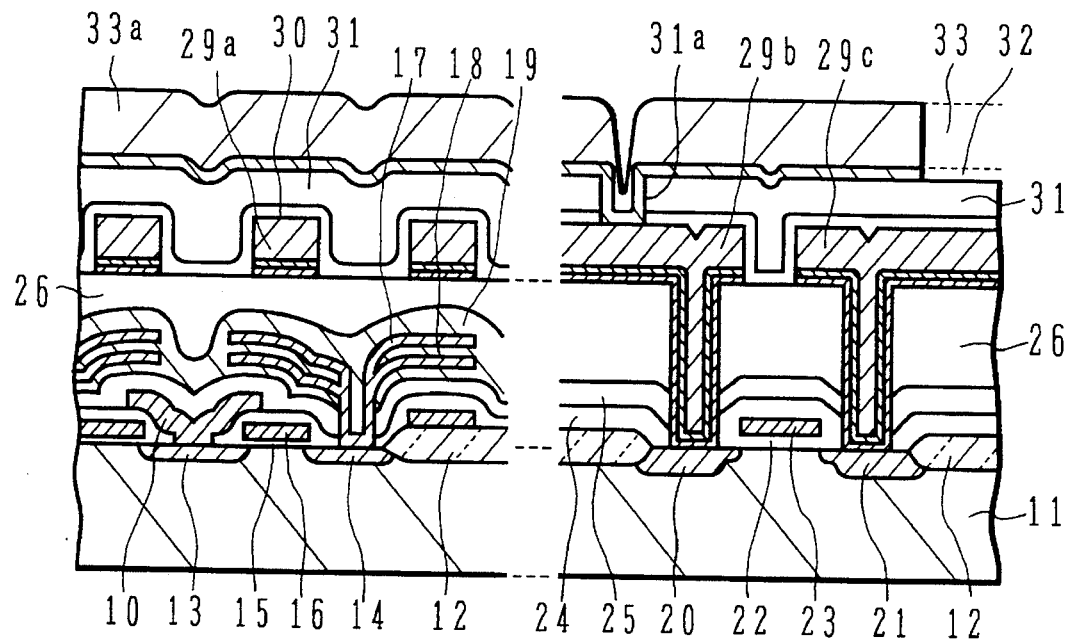

Fourth process (refer to FIG. 2D)

On the plasma oxide film 30 and the TEOS-$0_3$ oxide film 31 with the via hole 31a partially exposing the source wiring 29b, the TiN film 32 is sputtered to a thickness of 100 nm. The Al film 33 is sputtered on the TiN film 32 to a thickness of 500 nm, and patterned by photolithography and RIE to form the CLS line 33a and the source wiring 33b.

The TiN film 32 is used for improving a resistance against stress migration of the Al film 33.

With the above processes, the W film 29 of the first wiring layer and the Al film 33 of the second wiring layer have been formed. In a conventional semiconductor storage device, as described earlier, word lines and data bus lines are formed by the W film of the first wiring layer, and CLS lines are formed by the Al film 33 of the second wiring layer. Therefore, the data bus line has a high resistance, posing a large signal transmission delay on the data bus line.

Data bus lines of a semiconductor storage device of this embodiment are formed by a low resistance, thick third wiring layer as will be explained in the next process.

After this process, processes such as forming a passivation film are performed to complete the semiconductor storage device.

Figure 2E:
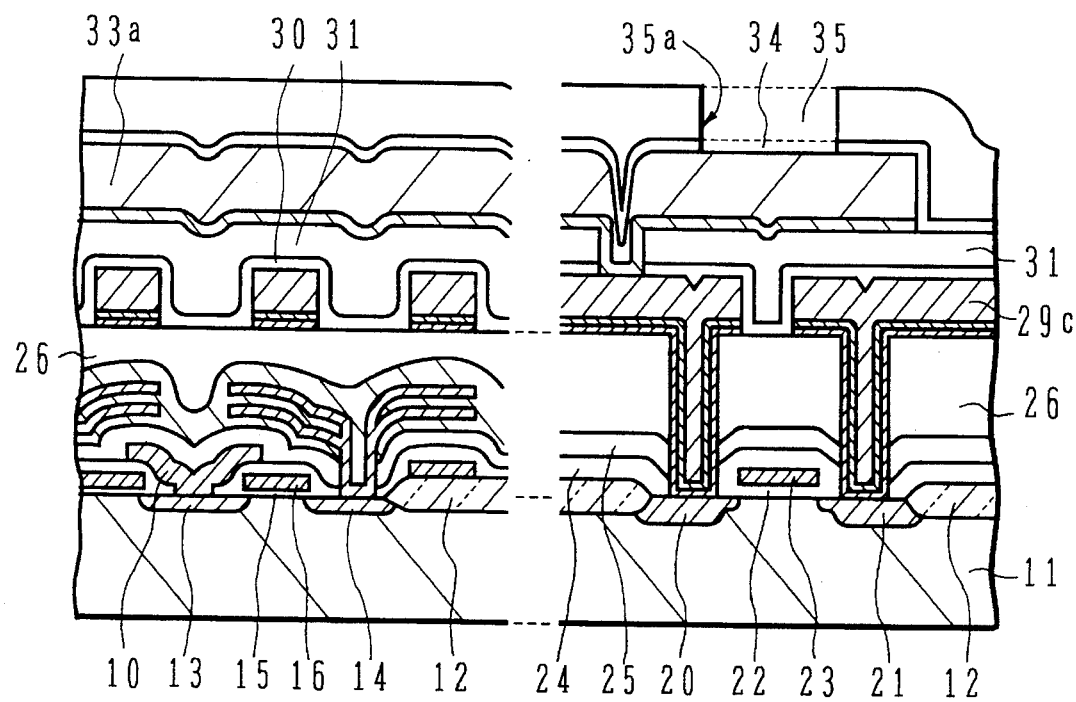

Fifth process (refer to FIG. 2E)

On the CLS line 33a formed by the fourth process, the plasma oxide film 34 is grown to a thickness of 100 nm on which film the TEOS-$O_3$ oxide film 35 is grown to a thickness of 1000 nm.

Thereafter, the TEOS-$0_3$ oxide film 35 and plasma oxide film 34 are patterned by photolithography and RIE to form the via hole 35a partially exposing the surface of the source wiring 33b. Thereafter, the resist film used by photolithography is removed.

Figure 2F:
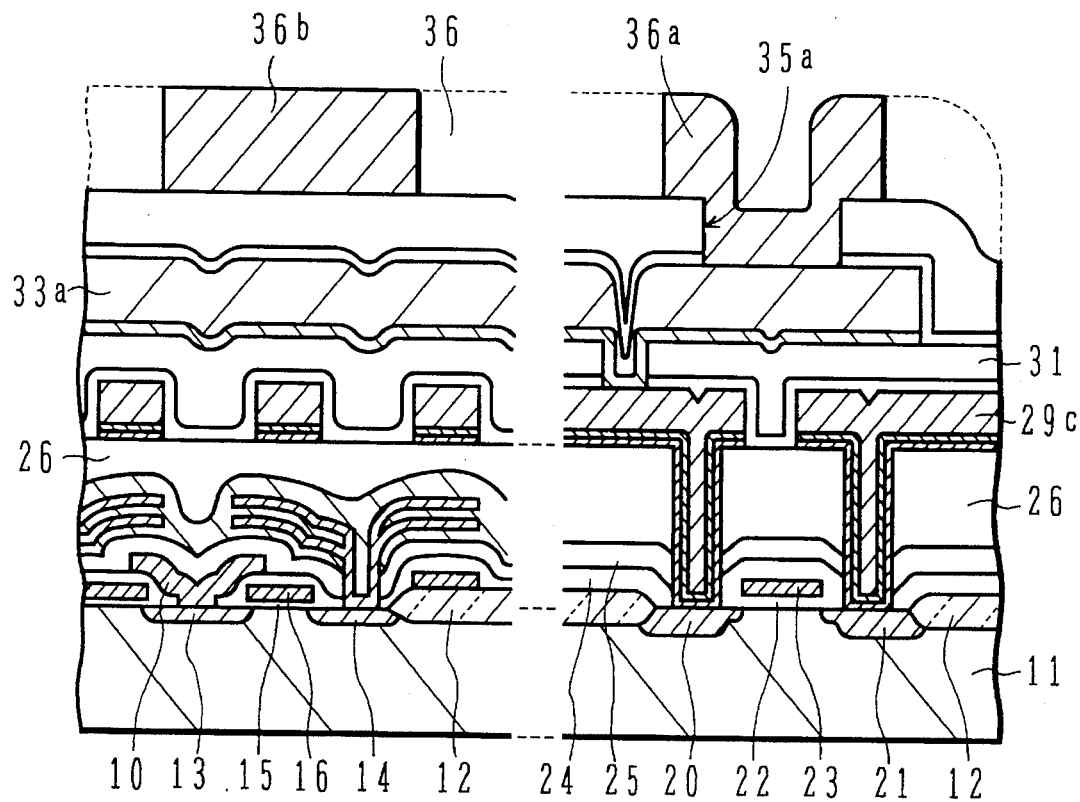

Sixth process (refer to FIG. 2F)

On the TEOS-0$_3$ film 35 formed with the via hole 35a, the A1 film 36 is sputtered to a thickness of 1.0 μm, and patterned by photolithography and RIE to form the data bus line 36a connected to the sense amplifier.

In FIG. 2F, the global word line 36b used by the second embodiment is also shown for the convenience of description to be later given.

After this RIE, the resist film used as an etching mask is removed.

Thereafter, processes such as forming a passivation film is performed to complete the semiconductor storage device.

An increase of manufacturing processes caused by an additional wiring layer of a DRAM chip is not good because of a rise of a chip cost.

As described earlier, it is very difficult to form a wiring line having a very high aspect ratio. It is therefore necessary to provide some special means to form a wiring line having a very high aspect ratio.

A DRAM chip cost is therefore required to be compared between an additional wiring layer and the means to form a high aspect ratio wiring line.

The conventional technique forms word lines and data bus lines by a thick aluminum film of the first wiring layer, whereas the embodiment forms word lines by the first wiring layer and data bus lines by the different third wiring layer. The embodiment method has about two additional processes as shown in FIGS. 2E and 2F. However, the conventional technique is considered to also require additional processes if the aspect ratio of a wiring line or contact hole is 2 or higher. Even if these additional processes are not taken into account, a difference between the numbers of processes is about 2% of the total number of processes. This difference may be easily compensated by a chip area reduced by the formation of long distance wiring lines and power supply lines by the third wiring layer.

In the above description of the first embodiment, the CLS line is formed by the second wiring layer and the data bus line is formed by the third wiring layer. The CLS line and data bus line may be formed interchangeably in the third and second wiring layers, respectively. Although a pair of column decoders CD is disposed on the right and left sides in FIG. 1A, if the length of the column select line CLS is desired to be shortened, the number of column decoders CD may be increased. The layouts of memory cell array blocks and row decoders are not limited only to those shown in FIG. 1A.

(Second Embodiment)

Figure 3:
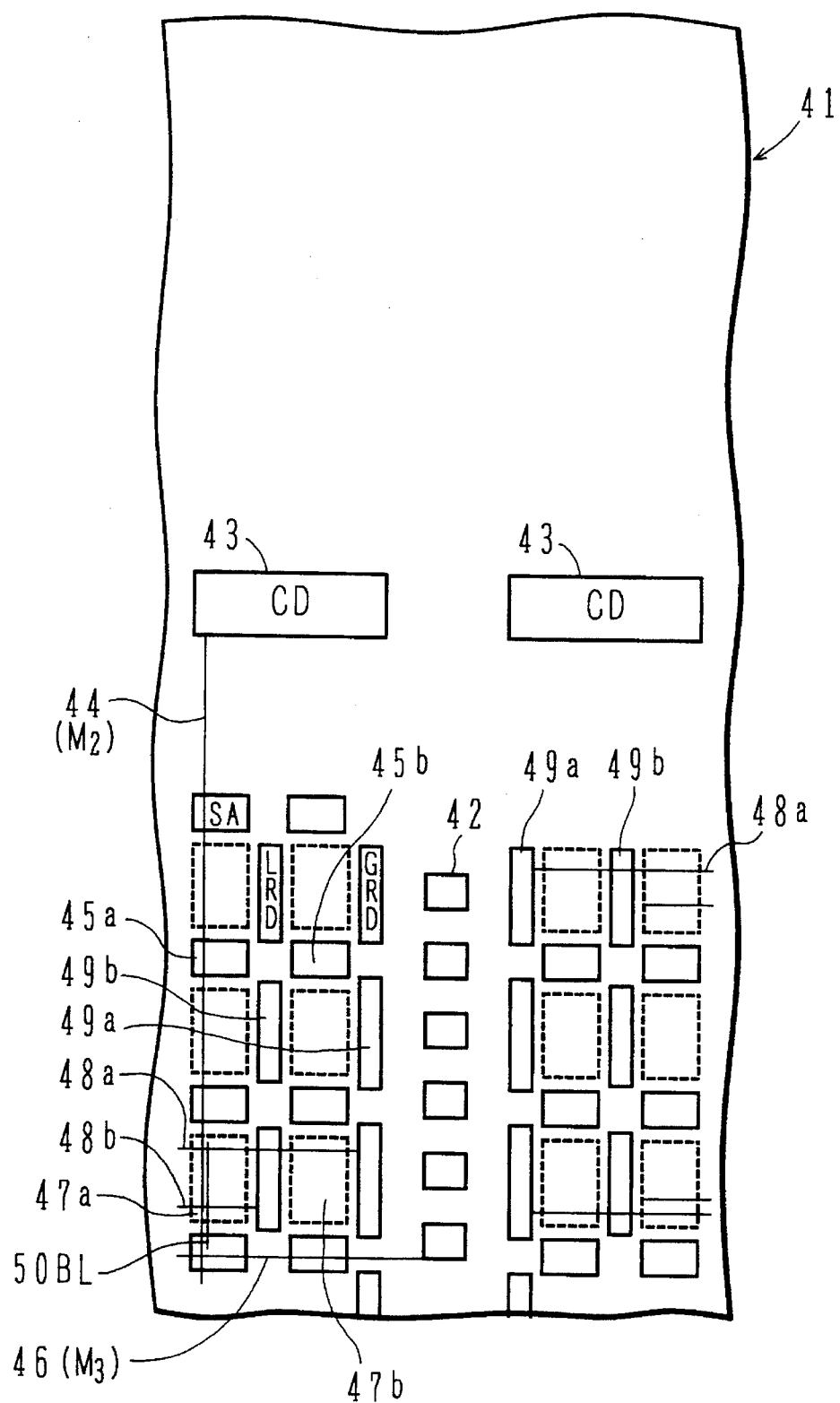
FIG. 3 is a schematic plan view of a semiconductor storage device according to a second embodiment of the invention.

FIG. 3 is a schematic plan view showing a layout of a DRAM chip according to a second embodiment of the invention.

A chip 41 shown in FIG. 3 includes input/output pads 42, column decoders 43, column select lines 44, sense amplifiers 45a, 45b, data bus lines 46, memory cell array blocks 47a, 47b, global word lines 48a, local word lines 48b, global row decoders 49a, local row decoders 49b, and bit lines 50. The global row decoder decodes, for example, upper (n−1) bits of an n-bit row address, and the local row decoder decodes the remaining one bit. A plurality of local decoders may be connected to one global decoder in the column direction.

As shown in FIG. 3, a plurality of input/output (I/0) pads 42 are disposed in line at the center of the chip 41 in the vertical direction as viewed in FIG. 3. The column decoders CD 43 are disposed near the center of the longer side of the chip 41 in parallel with the shorter side of the chip 41. A column address signal selected by the column decoder 43 is supplied via a column select signal (CLS) line 44 formed in parallel with the longer side of the chip 41, to the column select input terminal of a corresponding sense amplifier (S/A) 45a, or 45b.

A data bus line 46 for transferring an output from S/A 45a, 45b is disposed in parallel with the shorter side of the chip 41, and connected via the output circuit of S/A 45a, 45b to the I/0 pad 42.

Bit lines 50 are formed in each of memory cell array blocks 47a and 47b disposed in a matrix shape, the memory cell array blocks being divided into two groups on both sides of I/O pads 42. The bit line 50 made of a silicide film extends in parallel with the longer side of the chip 41 and is connected to the input side of an S/A 45a, 45b. Local row decoders 49b are disposed between memory cell array blocks 47a and 47b disposed in a matrix shape, the memory cell array blocks being divided into two groups on both sides of I/O pads 42. Local word lines 48b serve as the word lines in the memory blocks 47a, 47b, extend in parallel with the shorter side of the chip 41 and are connected to the local row decoders 49b. The local row decoder 49b is connected via the global word line 48a to one of the global row decoders 49a disposed on both sides of the pad 42. The local row decoder decodes the lower bit of a row address to select the local word line 48b. In FIG. 3, the global word line 48a traverses the local row decoder 49b and extends over the memory cell array block 47a. This assumes that the layout has other local row decoders belonging to the same global row decoder. The global word line is in parallel with the data bus line, and both the lines are formed by the same wiring layer.

The DRAM chip of this embodiment is similar to the first embodiment except that the row decoder is divided into the global row decoder 49a and the local row decoder 49b, the global row decoder 49a selects the ,Local row decoder 49b by using the global word line 48a formed by the third A1 wiring layer (M3), the selected local row decoder 49b decodes the lower bit to select the local word line 48b formed by the first W wiring layer (M1). The structure of the DRAM chip has a cross section similar to FIG. 2F. This structure can be realized by processes similar to the processes explained with FIGS. 2A to 2F. In FIG. 2F, the global word line 36b is in parallel with the data bus line 36a.

Although this layout uses the global word line 48a extending over a long distance, the local row decoder decodes the lowest row address bit, so that the number of global word lines is a half of the number of local word lines 48b which serve as actual word lines. If the local row decoder is arranged to decode more address bits, the number of global word lines becomes smaller. The number of global word lines 48a is generally less than the number of local word lines 48b, so that the width of the wiring can be made broader. Since the local word line 48b can be made short, the resistance of even a thin metal film poses no practical problem. In this manner, area of the chip 41 can be reduced and the high speed circuit operation can be achieved.

Even an increase in the resistivity of the first wiring layer (M1) can be compensated for by increasing the number of local row decoders 49b.

(Third Embodiment)

Figure 4A:
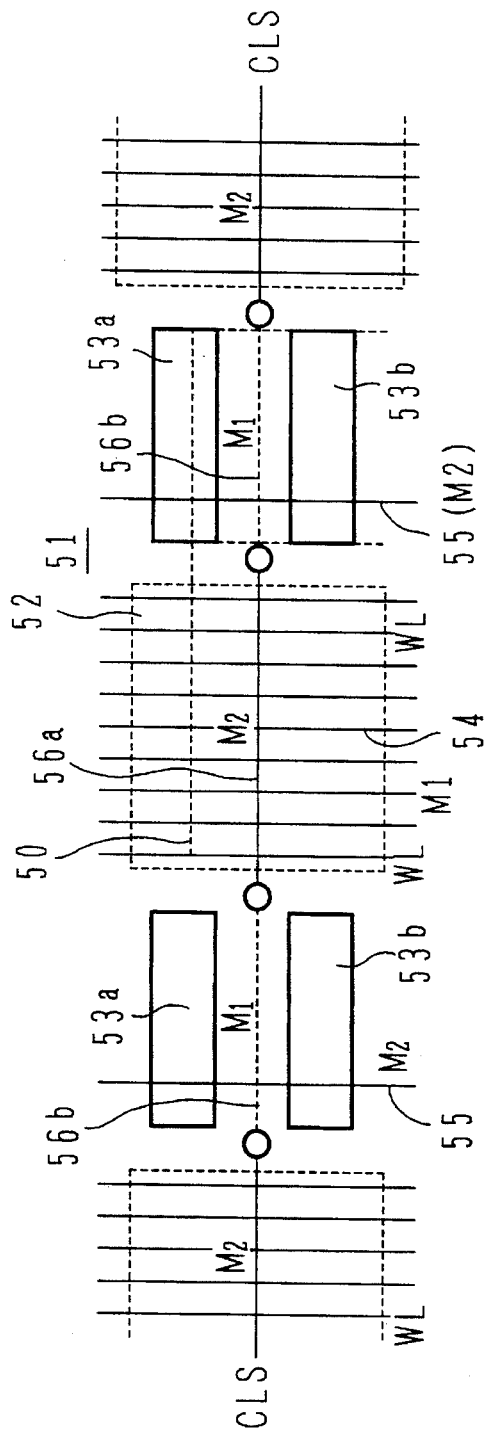
FIGS. 4A and 4B are schematic plan views explaining the structure of a semiconductor storage device according to a third embodiment of the invention.
Figure 4B:
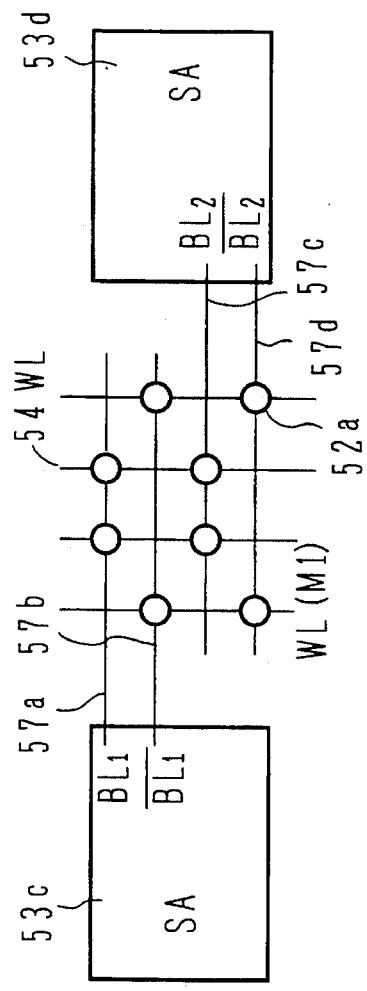

FIGS. 4A and 4B are schematic plan views of a semiconductor storage device according to a third embodiment of the present invention. FIG. 4A shows an outline of wiring lines, and FIG. 4B shows a relationship between sense amplifiers and memory cells.

A chip 51 shown in FIG. 4A includes memory cell array blocks 52, sense amplifiers 53a and 53b, word lines 54, data bus lines 55, column select lines 56a and 56b, and bit lines 57a to 57d.

Although the first and second embodiments use an additional wiring layer, this embodiment provides similar effects as the first and second embodiments without using an additional wiring layer.

As shown in FIG. 4A, in each memory cell array block 52 disposed in a matrix shape on the chip 51, bit lines 50 are formed of a silicide film under a metal wiring layer, the bit lines extending horizontally in the figure and being connected to the input side of S/A 53a, 53b. Word lines 54 formed by the first wiring layer extend vertically in the figure. Date bus line 55 formed by the second wiring layer extend vertically in the figure, and transfer outputs from the sense amplifiers S/A 53a, 53b.

Column select lines CLS 56a and 56b for selecting S/A are formed over the memory cell array blocks 52 by the second Al wiring layer (M2) having a thickness of 1 µm, and over the S/A region by the first W wiring layer (M1) having a thickness of 400 nm. The word lines are disposed from the memory cell array blocks toward the row decoders, and are not disposed on the region between the memory cell array blocks, which region includes the sense amplifiers. The wiring layer for word lines can be used therefore also for CLS lines in this region. Similarly, the data bus lines are disposed on the region of the sense amplifiers, and are not disposed on the region of the memory cell array blocks. Therefore, the wiring layer for data bus lines can be used also for CLS lines on the region of the memory cell array blocks.

With tills arrangement of the CLS lines, both the word lines 54 having a low aspect ratio and high reliability and the data bus lines 55 having a relatively low resistance can be realized by the two-layer structure.

The first wiring layer (Mi) is also used as wiring lines and interconnections in the circuit of S/A 53a, 53b. It is not always possible to arbitrarily disposing the CLS lines across S/A 53a, 58b.

FIG. 4B shows an example of the layout of sense amplifiers and memory cells. Four bit lines 57a to 57d connected to memory cells 52a are disposed in the region having a width corresponding to the sense amplifier area, and the sense amplifiers are disposed on both sides of the memory cell array block.

In this case, each S/A 53c, 53d is disposed in the region having a width corresponding to the four bit lines 57a to 57d. In short, the width of the S/A region is doubled. There is therefore a space for forming the CLS lines 56a and 56b by the first wiring layer (M1).

However, since the sense amplifiers 53aand 58b are disposed on both sides of the memory cell array block, a chip area increases. A chip area increase of this embodiment is unavoidable although the resistance of a data bus line of the DRAM chip can be reduced without increasing the number of processes.

There is another disadvantage of a lower performance than the first and second embodiments, to be caused by a signal transmission delay by part of the CLS line 56b formed by the first wiring layer (M1) in the region of S/A 53a, 53b.

Although there are such disadvantages, the cost and performance are better than the conventional technique.
(Fourth Embodiment)

Figure 5A:
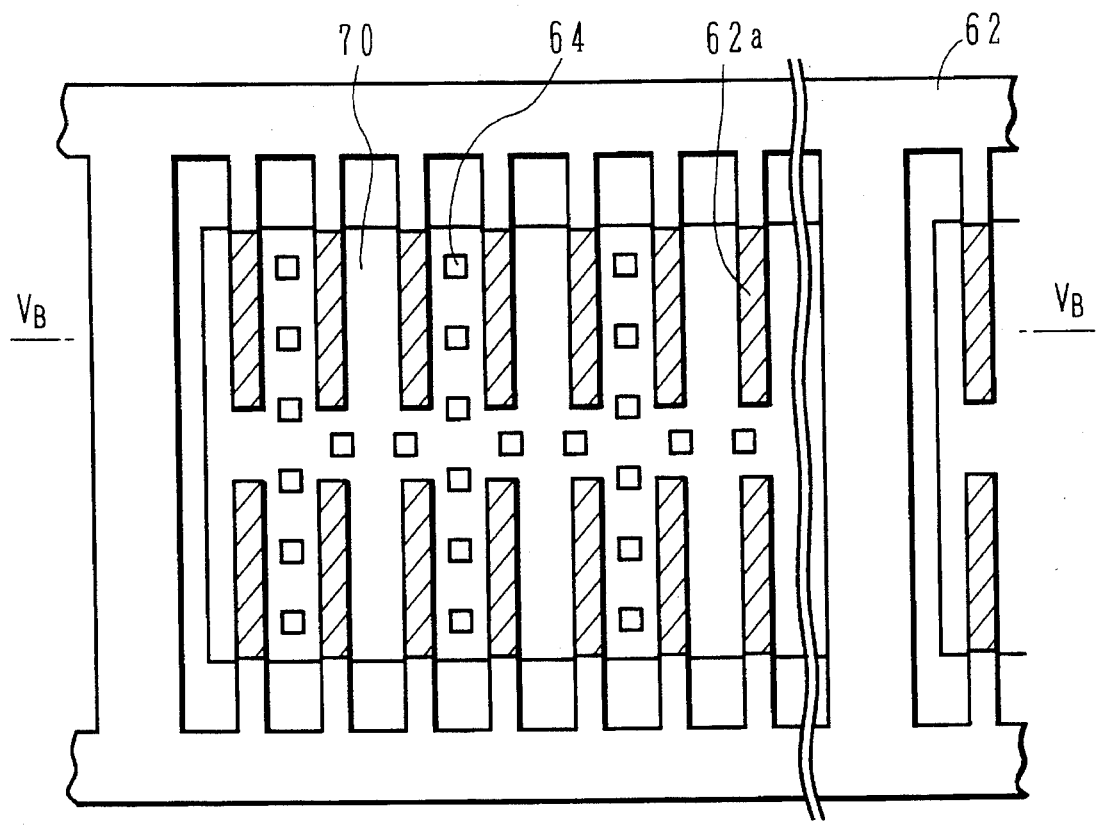
Figure 5B:
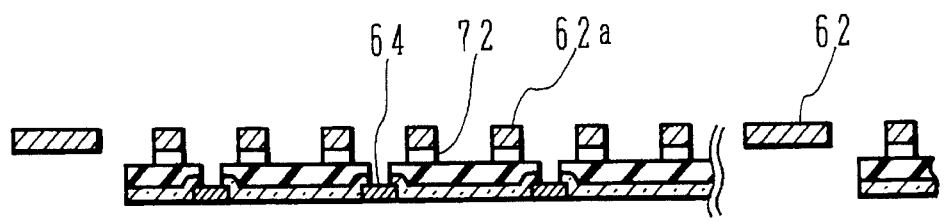
Figure 5C:
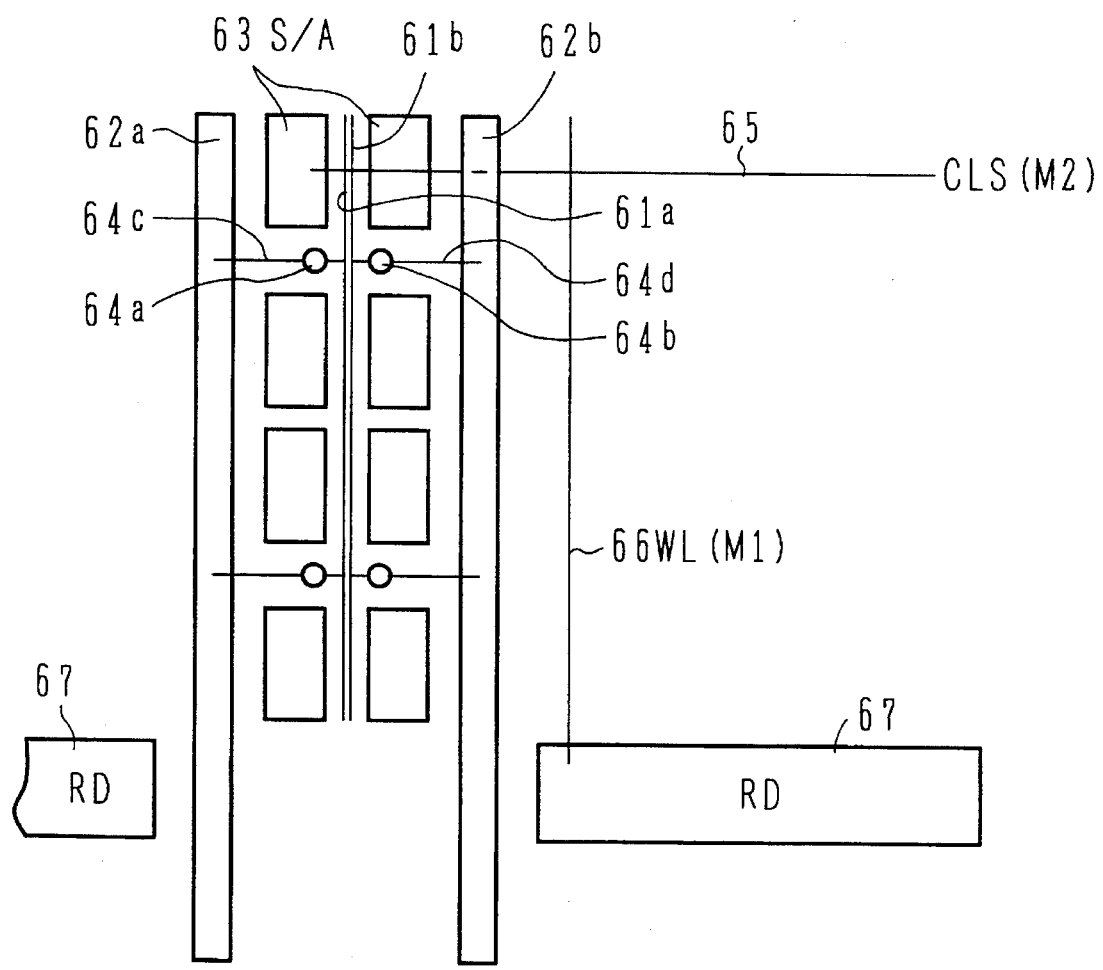

FIG. 5A to 5F show a semiconductor storage device according to a fourth embodiment of the invention. FIG. 5A is a plan view showing a lead frame bonded to a chip, and FIG. 5B is a cross sectional view taken along line VB—VB in FIG. 5A. FIG. 5C shows the main part of the lead frame and wiring lines.

As shown in FIG. 5A, plural lines of bonding pads 64 are formed on a semiconductor chip 70. Leads 62a of a lead frame 62 extend toward the region where the bonding pads 64 are not formed, and are adhered thereto by both-side adhesive tapes.

Elements represented by reference numerals in FIGS. 5A to 5F include local data bus lines 61a and 61b, a lead frame 62, main data bus lines 62a and 62b, S/A 68, pads 64a and 64b, bonding wires 64c and 64d, CLS lines 65, word lines 66, and row decoders 67.

FIG. 5C shows enlarged schematic top plan view of the chip. Leads 62a and 62b are part of the lead frame as shown in FIGS. 5A and 5B and serve as main data bus lines. Sense amplifiers 63 are disposed in line between the leads 62a and 62b of the lead frame, and a memory cell array block is disposed on the right side of the lead 62b. Word lines 66 connected to the row decoder 67 are disposed in the region of the memory cell array block.

The data bus line is divided into the local data bus line 61a,61b formed by the first wiring layer (M1) and a main data bus line 62a, 62b formed by the lead of the lead frame. The local data bus line and main data bus line are connected by wire bonding.

The local data bus line 61a, 61b is formed by the first wiring layer (M1) in the region of S/A 63. The local data bus line connected to an output circuit of S/A 63 is connected via a pad 64a, 64b and a bonding wire 64c, 64d to the main data bus line 62a, 62b.

The CLS line 65 connected to S/A 63 is formed by the second wiring layer (M2), and the word line 66 connected to the row decoder 67 is formed by the first wiring layer (M1).

This layout shortens the local data bus lines 61a and 61b so that the total resistance of the data bus line can be reduced even if the sheet resistance of the local data bus lines 61a and 61b b is high.

Figure 5D:
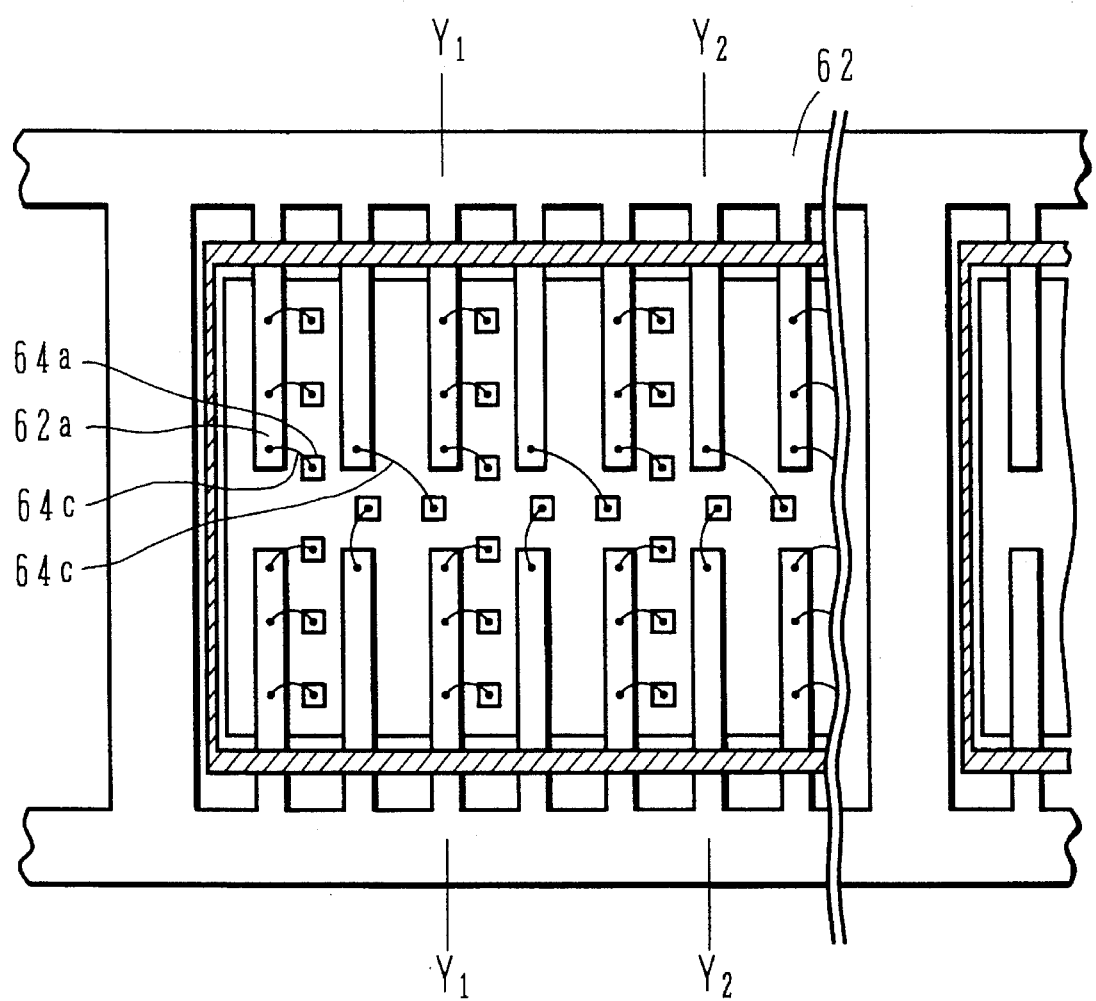
Figure 5E:
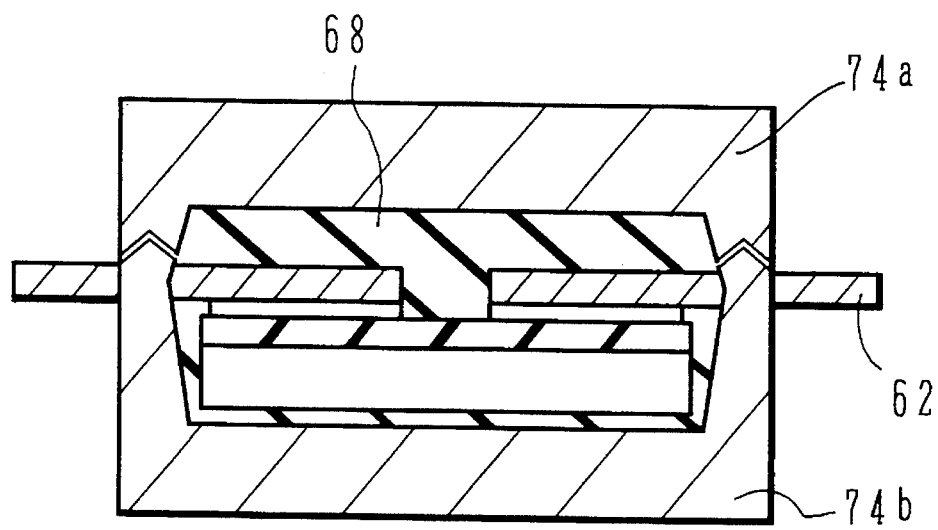
Figure 5F:
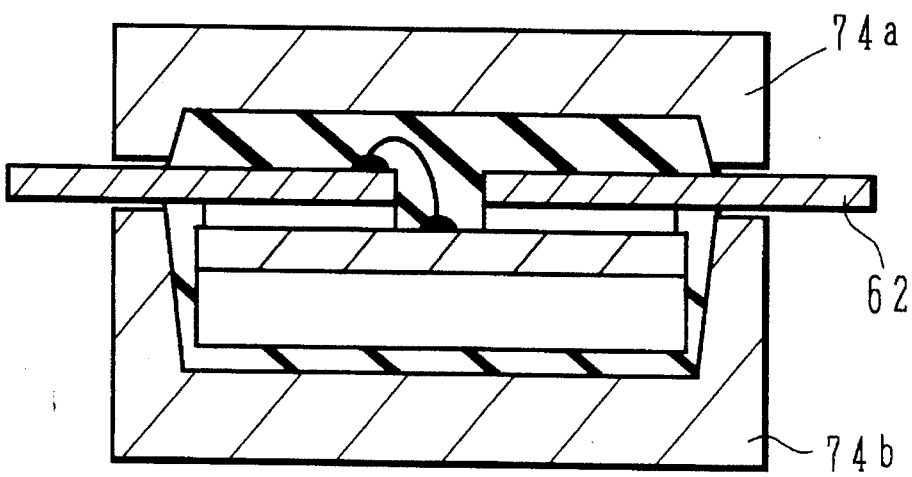
Figure 6:
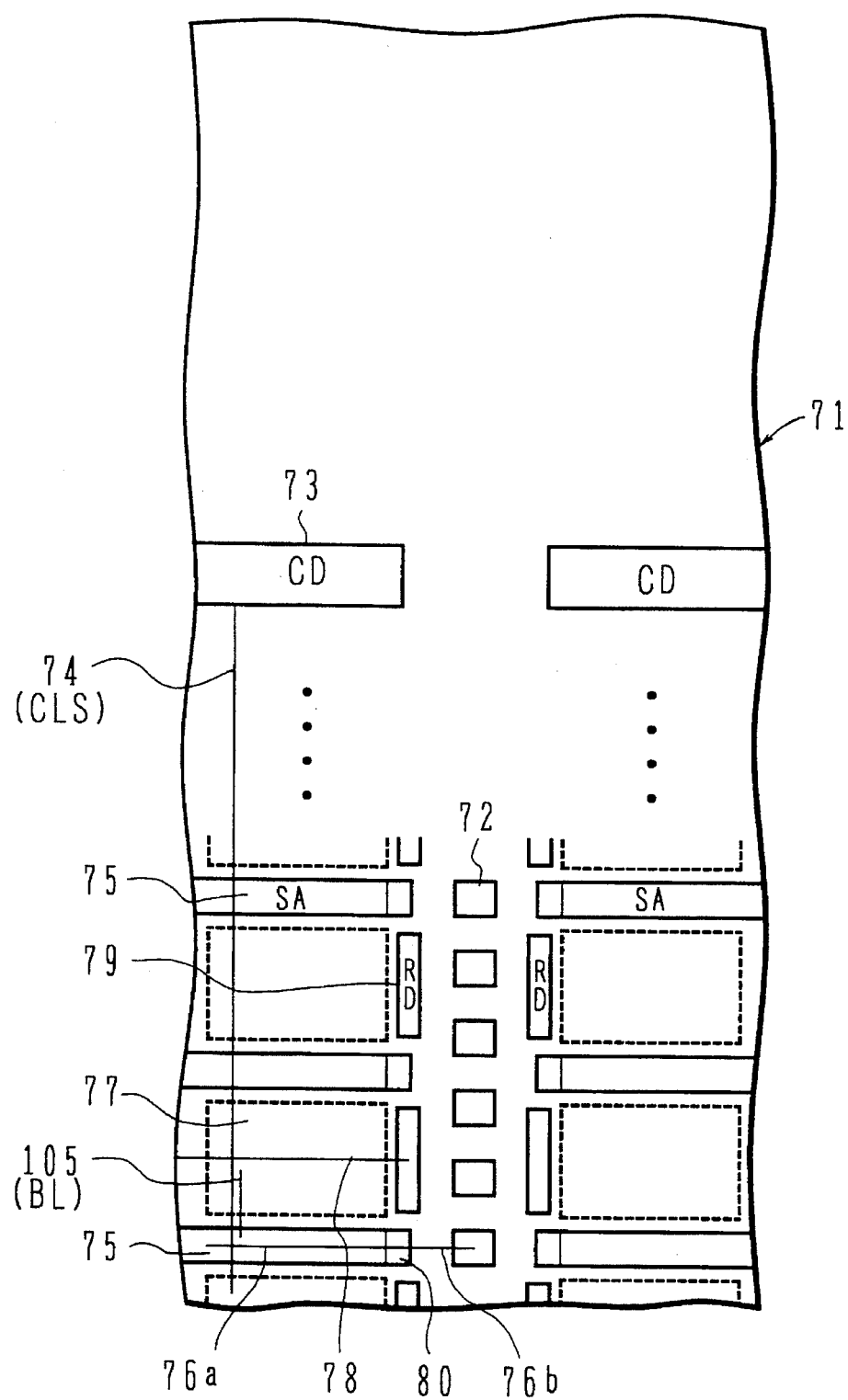
FIG. 6 is a schematic plan view showing a layout of a DRAM chip according to a conventional technique.
Figure 7A:
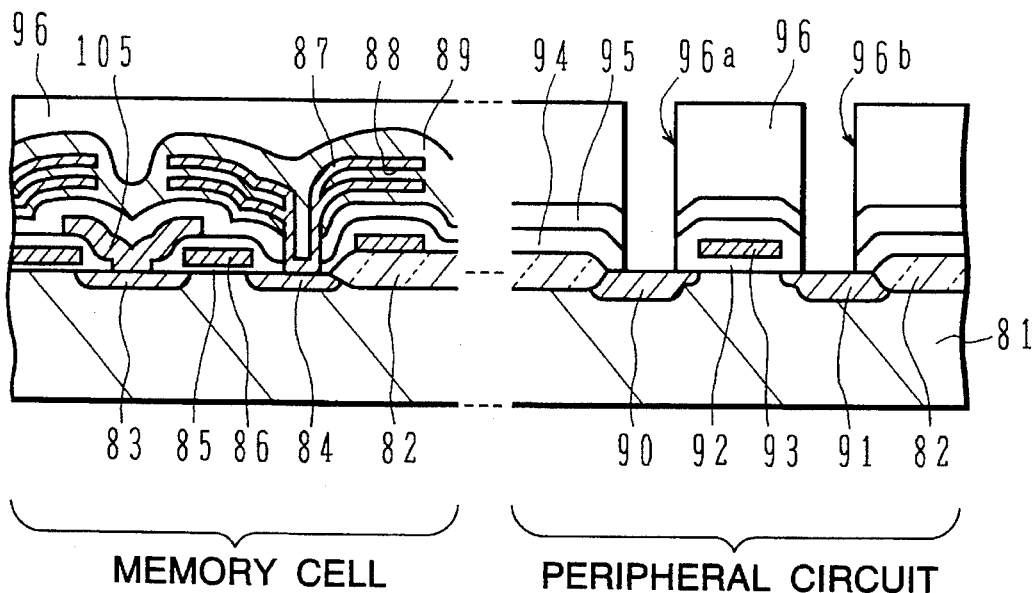
FIGS. 7A to 7D are cross sectional views explaining the processes of manufacturing a conventional DRAM chip.
Figure 7B:
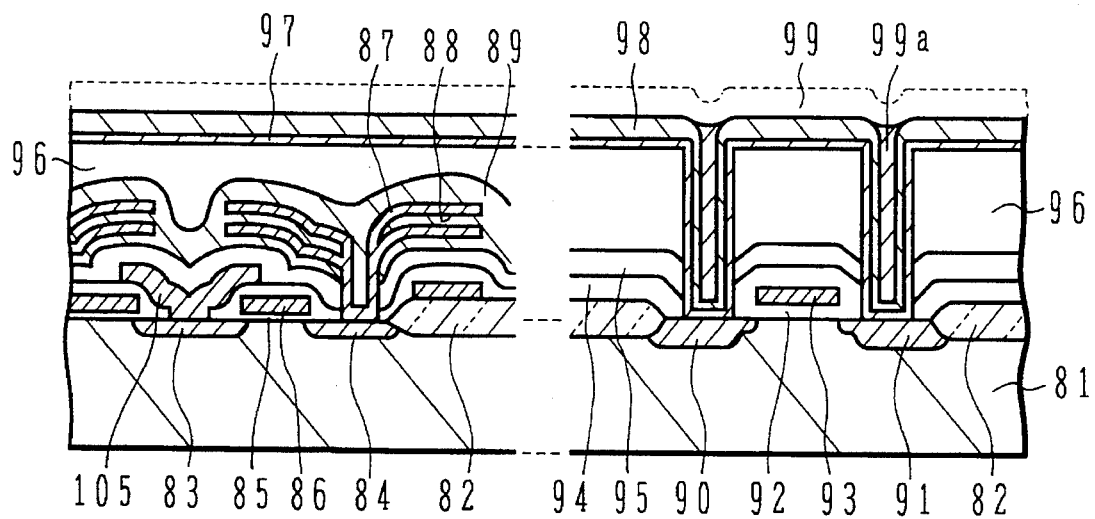
Figure 7C:
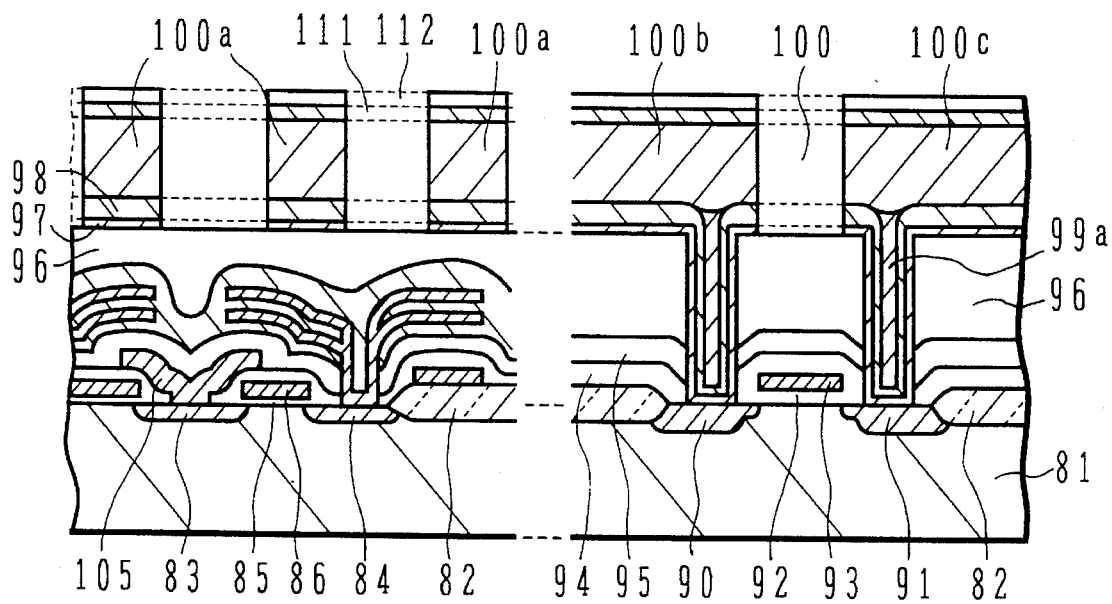
Figure 7D:
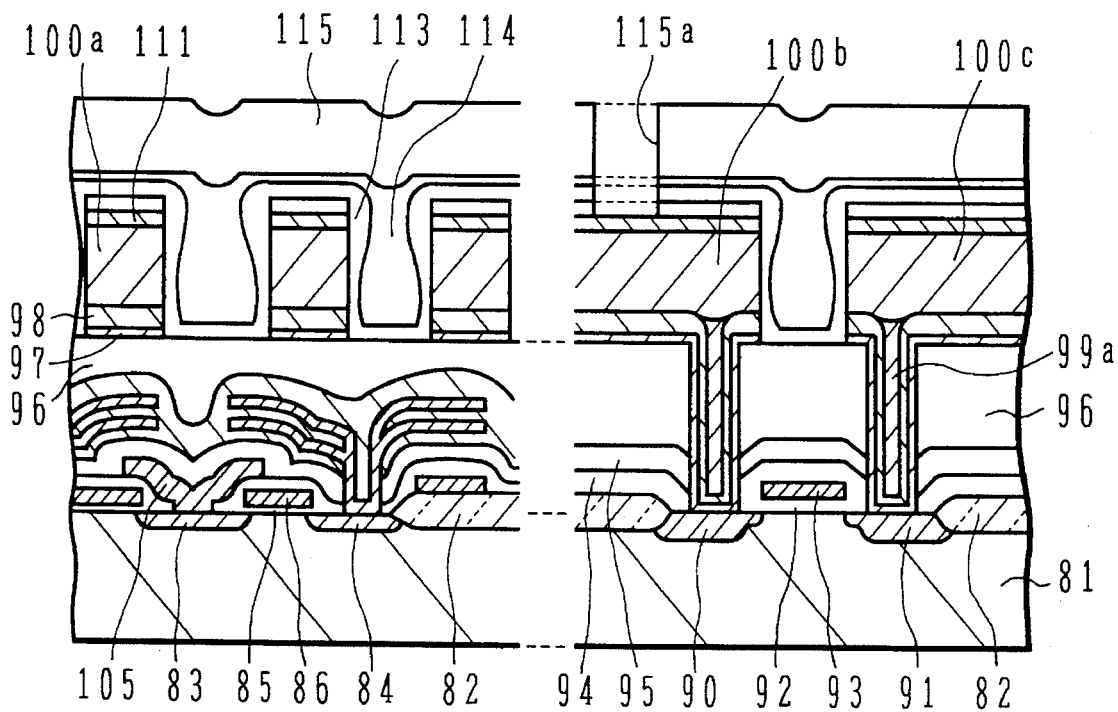

In wiring a data bus line, after the lead frame 62 is adhered to the surface of the chip 70 as shown in FIGS. 5A and 5B, the pad 64a, 64b is electrically connected by the bonding wire 64c, 64d to the main data bus line 62a, 62b as shown in FIG. 5D. As shown in FIGS. 5E and 5F, the lead frame 62 is sandwiched between metal molds 74a and 74b. Some leads are cut off as shown in FIG. 5E, and the remaining leads are extended to the outside as shown in FIG. 5F. Next, the chip is molded by sealing resin 68. Thereafter, the peripheral dam area of the lead frame 62 is cut so that the externally extending leads are mutually electrically separated to form external terminals of the integrated circuit.

The local data bus of this embodiment is formed by a thin film. However, since its length is short, the resistance is small. A sufficiently low resistance can be realized for a bonding wire and a lead. Therefore, the total resistance can be maintained low. Although separate (twice) cutting of leads are required for external terminal leads and for data bus lines, the process increase is little.

In this embodiment, a lead of a lead frame is used as part of a data bus line. Part of a word line may also be formed by a lead of a lead frame. For example, the global line of the second embodiment may be formed by a lead and a bonding wire.

The present invention has been described in connection with the preferred embodiments. The invention is not limited only to the above embodiments. It is apparent to those skilled in the art that various changes, modifications, substitutions, combinations and the like can be made without departing from the scope of the appended claims.

I claim:

1. A semiconductor storage device having a semiconductor chip, comprising:
   a memory cell array including a plurality of memory cells disposed in a matrix shape of rows and columns;
   a plurality of word lines each connected to memory cells of a corresponding row;
   a row decoder for selecting a word line;
   a plurality of bit lines each connected to memory cells of a corresponding column;
   a plurality of sense amplifiers, each including a sense amplifier select transistor, and having an input electrode connected to a corresponding bit line;
   a column select line connected to a gate electrode of each of the sense amplifier select transistors;
   a column decoder for selecting a column select line; and
   a data bus line connected to an output electrode of each of the sense amplifier select transistors,
   wherein said column select line is disposed intersecting said word lines and said data bus line, and at least part, of said word line and at least part of said data bus line are formed by different wiring layers.

2. A semiconductor storage device according to claim 1, wherein said word line is formed by a first level metal wiring layer, said column select line is formed by a second level metal wiring layer formed over said first level metal wiring layer, and said data bus line is formed by a third level metal wiring layer formed over said second level wiring layer.

3. A semiconductor storage device according to claim 1, wherein said row decoder includes a global row decoder and a local row decoder, said word line includes a local word line connecting memory cells to said local row decoder and a global word line connecting said local row decoder and said global row decoder, said local word line is formed by a first level metal wiring layer, said column select line is formed by a second level metal wiring layer formed over said first level metal wiring layer, and said data bus line and said global word line are formed by a third level metal wiring layer formed over said second level wiring layer.

4. A semiconductor storage device according to claim 3, wherein said memory cell array is configured to form a plurality of array blocks at different columns, and said global and local row decoders are disposed at different column positions.

5. A semiconductor storage device according to claim 4, wherein said row decoder a plurality of said local row decoders connected in common to said global row decoder.

6. A semiconductor storage device according to claim 1, wherein said word line is formed by a first level metal wiring layer, said data bus line is formed by a second level metal wiring layer over said first level metal wiring layer, and said column select line is formed by said second level metal wiring layer at a region corresponding to said memory cell array, and by said first level metal wiring layer at a region corresponding to said sense amplifier, said first and second level metal wiring layers of the column select line being connected at a region between said memory cell array and said sense amplifier.

7. A semiconductor storage device according to claim 6, wherein said plurality of sense amplifiers are disposed on both sides of at least part of said memory cell array, and said word line formed at the region corresponding to said memory cell array is selectively connected to one off two sense amplifiers disposed on both sides of said memory cell array.

8. A semiconductor storage device according to claim 1, further comprising:

metal lead adhered to, and insulated from, said semiconductor chip;
a metal pad formed on said semiconductor chip; and
bonding wire for bonding said metal pad and said metal lead,
wherein said data bus line is divided into a local data bus line and a main data bus line, said word line and said local data bus line are formed by a first level metal wiring layer, and said main data bus line is formed by said bonding wire and said metal lead.

9. A semiconductor storage device according to claim 8, wherein said column select line is formed by said second level metal wiring layer over said first level metal wiring layer.

10. A semiconductor storage device according to claim 9, wherein said metal lead is disposed at an intermediate area between said memory cell array and said sense amplifier.

11. A semiconductor storage device according to claim 1, further comprising a metal lead formed of a same metal layer as said third level metal layer and disposed on said semiconductor chip.

12. A semiconductor storage device according to claim 3, further comprising a metal lead formed of a same metal layer as said third level metal layer and disposed on said semiconductor chip.

13. A semiconductor storage device having a semiconductor chip, comprising:
   a memory cell array including a plurality of memory cells disposed in a matrix shape of rows and columns;
   a plurality of local word lines each connected to memory cells of a corresponding row;
   a local row decoder for selecting a local word line;
   a plurality of global word lines connected to said local row decoder;
   a global row decoder for selecting a global word line;
   a plurality of bit lines each connected to memory cells of a corresponding column;
   a plurality of sense amplifiers, each including a sense amplifier select transistor, and having an input electrode connected to a corresponding bit line;
   a column select line connected to a gate electrode of each of the sense amplifier select transistors;
   a column decoder for selecting a column select line; and
   a data bus line connected to an output electrode of each of the sense amplifier select transistors,
   wherein said local word line is formed by a first level metal wiring layer, said column select line is formed by a second level metal wiring layer over said first level metal wiring layer, and said global word line is formed by a third level metal wiring layer over said second level metal wiring layer.

14. A semiconductor storage device according to claim 13, further comprising a metal lead formed of a same metal layer as said third level metal layer and disposed on said semiconductor chip.

15. A semiconductor storage device having a semiconductor chip, comprising:
   a memory cell array including a plurality of memory cells disposed in a matrix shape of rows and columns;
   a plurality of word lines each connected to memory cells of a corresponding row;
   a row decoder for selecting a word line;
   a plurality of bit lines each connected to memory cells of a corresponding column;

a plurality of sense amplifiers, each including a sense amplifier select transistor, and having an input electrode connected to each bit line;

a column select line connected to a gate electrode of each of the sense amplifier select transistors;

a column decoder for selecting a column select line; and a data bus line connect to an output electrode of each of the sense amplifier select transistors, wherein said column select line is disposed intersecting said word lines and said data bus line, and at least part of said word line and at least part of said data bus line are formed by different wiring layers said first and second level metal wiring layers of the column select line being connected at a region between said memory cell array and said sense amplifier.

16. A semiconductor storage device according to claim 15, further comprising a metal lead formed of a same metal layer as said third level metal layer and disposed on said semiconductor chip.

* * * * *